US009097775B2

(12) United States Patent
Kerfoot, Jr. et al.

(10) Patent No.: US 9,097,775 B2
(45) Date of Patent: Aug. 4, 2015

(54) APPARATUS AND METHOD FOR DISCHARGING A BATTERY AND DETERMINING A CONDITION OF THE BATTERY

(71) Applicant: MOTOROLA SOLUTIONS, INC., Schaumburg, IL (US)

(72) Inventors: Roy L. Kerfoot, Jr., Lilburn, GA (US); Michael D. Geren, Suwanee, GA (US); John E. Herrmann, Suwanee, GA (US)

(73) Assignee: Motorola Solutions, Inc., Schaumburg, IL (US)

( * ) Notice: Subject to any disclaimer, the term of this patent is extended or adjusted under 35 U.S.C. 154(b) by 421 days.

(21) Appl. No.: 13/675,234

(22) Filed: Nov. 13, 2012

(65) Prior Publication Data

US 2014/0132223 A1    May 15, 2014

(51) Int. Cl.
*G01N 27/416* (2006.01)
*G01R 31/36* (2006.01)

(52) U.S. Cl.
CPC ........ *G01R 31/3662* (2013.01); *G01R 31/3631* (2013.01); *G01R 31/3679* (2013.01)

(58) Field of Classification Search
CPC ............. H02J 7/0047; G01R 31/3651; G01R 31/3658; G01R 31/3666; G01R 31/3675; G01R 31/3679
USPC .......... 320/107, 132, 149; 324/426, 427, 430, 324/433
See application file for complete search history.

(56) References Cited

U.S. PATENT DOCUMENTS

| 4,259,639 | A * | 3/1981 | Renirie .................. 324/430 |
| 4,697,134 | A | 9/1987 | Burkum et al. |
| 4,916,438 | A | 4/1990 | Collins et al. |
| 5,164,653 | A | 11/1992 | Reem |
| 6,331,762 | B1 | 12/2001 | Bertness |
| 6,504,344 | B1 | 1/2003 | Adams et al. |
| 6,967,467 | B2 | 11/2005 | Riley et al. |
| 7,330,013 | B2 | 2/2008 | Wolin et al. |
| 7,352,156 | B2 | 4/2008 | Ashizawa et al. |
| 7,554,294 | B2 | 6/2009 | Srinivasan et al. |
| 7,605,591 | B2 | 10/2009 | Tsenter et al. |
| 7,719,235 | B2 | 5/2010 | Sano et al. |
| 7,788,052 | B2 | 8/2010 | Iwane et al. |
| 2005/0248313 | A1 | 11/2005 | Thorland |
| 2006/0176020 | A1 | 8/2006 | Ibrahim |
| 2007/0105010 | A1 | 5/2007 | Cassidy |

(Continued)

FOREIGN PATENT DOCUMENTS

GB    2411058 A    8/2005
WO    WO 2011/109831    5/2011

OTHER PUBLICATIONS

Corresponding International Application No. PCT/US2013/069493—International Search Report Dated Aug. 11, 2014.
Michael Vega—"Single-Cell Impedance Track (TM) Gas Gauge for Novices"—Texas Instruments, Jun. 2007.

*Primary Examiner* — Edward Tso
(74) *Attorney, Agent, or Firm* — Barbara R. Doutre (57) ABSTRACT

A method and apparatus for determining the condition of a rechargeable battery determines a dynamic impedance of the battery while discharging the battery, and determines a battery condition category based on the dynamic impedance. The battery can be discharged in a manner that recovers the stored energy being discharged from the battery.

17 Claims, 5 Drawing Sheets

(56) References Cited

U.S. PATENT DOCUMENTS

| | | |
|---|---|---|
| 2007/0152637 A1 | 7/2007 | Cherng et al. |
| 2010/0060237 A1 | 3/2010 | Hsieh |
| 2011/0313613 A1 | 12/2011 | Kawahara et al. |
| 2012/0001595 A1 | 1/2012 | Maruyama et al. |
| 2012/0025766 A1 | 2/2012 | Reade et al. |

* cited by examiner

APPARATUS AND METHOD FOR DISCHARGING A BATTERY AND DETERMINING A CONDITION OF THE BATTERY

FIELD OF THE DISCLOSURE

The invention relates generally to battery dischargers, and more particularly battery diagnostics and determining battery condition.

BACKGROUND

In organizations that depend on portable devices to conduct operations, it is valuable to be able to know the battery condition of the batteries used to power the portable devices, in addition to the state of charge. An example of such an organization would be a public safety organization, such as police, fire, and rescue, and an example of portable devices would be the portable two-way radios used by such people in conducting operations. Public safety personnel going on a deployment need to have fully charged batteries that are in good condition. Accordingly, it is beneficial if the state of charge and battery condition are easily discernible before going on a deployment. The state of charge is akin to a fuel gauge, indicating approximately the proportion of battery capacity remaining in the battery. The condition of the battery is indicative of its age, in terms of both cycle life (the number of charge/discharge cycles) and chronological age, in addition to the random degradation over time. Typically as rechargeable batteries age their maximum capacity diminishes and their internal impedance increases.

Some manufacturers have built in so called "fuel gauges" into rechargeable battery packs that track, internally, charging and discharging, as well as charge/discharge cycles. The fuel gauge can retain state of charge and condition information in a memory in the rechargeable battery pack that can be read by a device powered by the battery pack. However, many battery packs do not have a fuel gauge capability.

Without the constant and close monitoring of battery current, both discharge and charge, it is difficult to determine the state of charge of a battery pack. The best way to determine the capacity of given battery pack and to charge it fully is to discharge it to an end of discharge condition, and then charge it to a fully charged condition, as indicated by certain known criteria based on battery parameters such as changes in voltage, temperature, and current while charging. Once a battery pack has been discharged and recharged then the capacity of the battery pack can be determined and it is then known that the battery pack is fully charged. However, determining capacity and state of charge does not directly indicate the condition of the battery—a fully charged battery near the end of its cycle life does not have the same capacity as new battery with very few charge/discharge cycles. Furthermore, discharging batteries can generate considerable heat, particular in organizations with a large number of batteries. This heat represents a loss of energy.

Accordingly, there is a need for an apparatus and method for discharging a battery to determine its condition, and further to make use of the energy dissipated from a battery upon being discharged.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Embodiments include a method of discharging a rechargeable, and while discharging the rechargeable battery, monitoring a dynamic battery current and a dynamic battery voltage of the rechargeable battery while discharging the rechargeable battery. The method can further include determining a dynamic impedance of the rechargeable battery responsive to monitoring the dynamic battery current and the dynamic battery voltage. The method can also include determining a battery condition category by categorizing the dynamic impedance into one of a plurality of battery condition categories.

Figure 1:
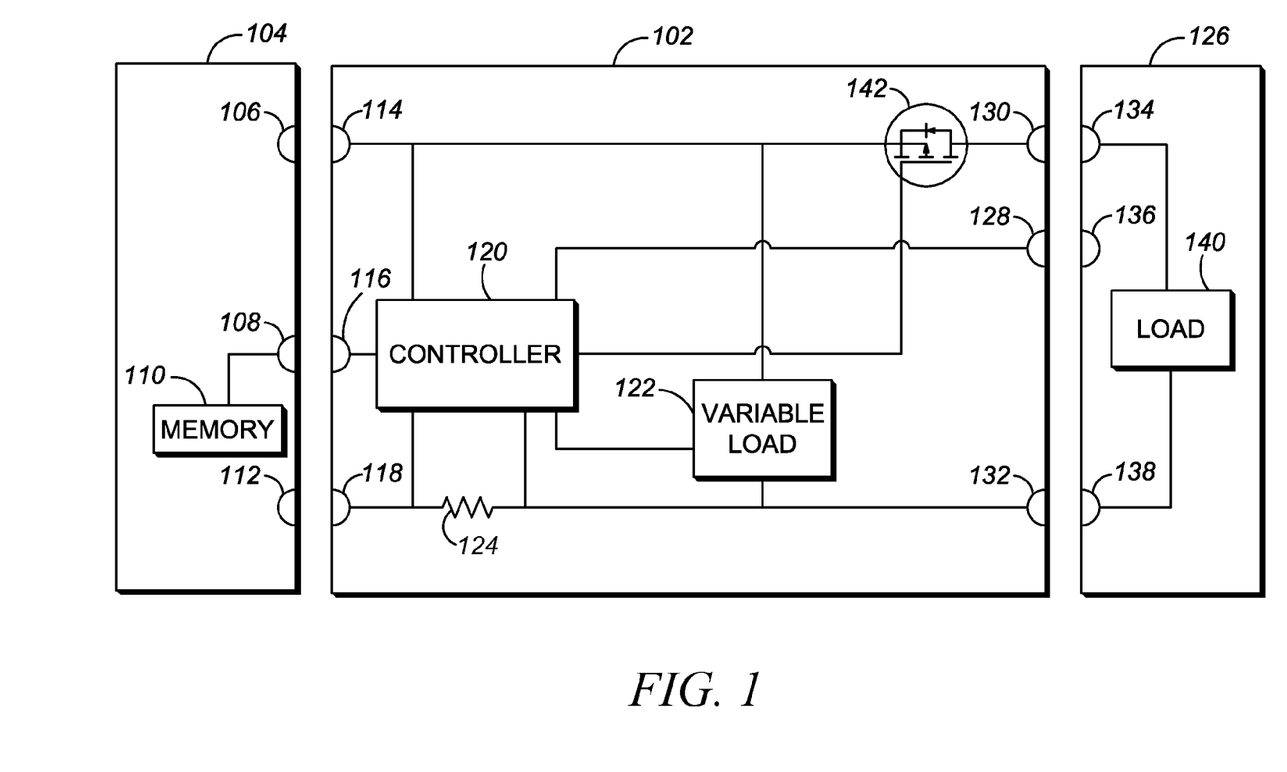
FIG. 1 is a block diagram of battery discharger system in accordance with some embodiments.

FIG. 1 is a block diagram of battery discharger system 100 in accordance with some embodiments. The system 100 includes a battery discharger 102 that can connect to a rechargeable battery or battery pack 104 and discharge the battery, also determine a condition of the rechargeable battery (meaning the rechargeable battery cells). The rechargeable battery 104 can include a set of battery contacts, including a positive contact 106, and data contact 108, and a negative contact 112. The battery pack 104 can include a memory 110 that is connected to the data contact 108, and can be used to store information, including battery condition information. The discharger 102 can read the information to determine nominal parameter and information about the battery 104, such as the nominal capacity, the chemistry of the cells, and so on. The battery discharger 102 can include a set of contacts that mate with the battery contacts, include a positive discharger contact 114, a discharger data contact 116, and a discharger negative contact 118. The term "contact" refers to electrically conductive members that are used to make physical, and hence electrical contact, with mating contacts. The discharger can further include a controller 120 that can be, for example, a microcontroller that executes instruction code in accordance with the teachings herein. The discharger can further include an internal load network 122 that includes a variable load. As used herein, the term "load" refers to a resistance through which electrical current from the battery is passed to discharge the battery. Loads can be passive, active, or storage loads, or combinations thereof. A passive load can be, for example, a fixed value resistance. An active load can vary in resistance and be regulated. A storage load stores some of the energy provided by the battery as it discharges, such as when one battery is used to charge another battery.

Upon connecting a battery 104 to the discharger 102, the discharger can commence discharging the battery 104 through the variable load 122. The controller can adjust or vary the load magnitude of the variable load 122, and in some embodiments to the variable load 122 can be controlled from essentially an open circuit to a near-short circuit, or any resistance value in between. To determine the condition of the battery 104, the controller sets the variable load to a first value, and measures the battery voltage (the voltage between contacts 114, 118) and the discharge current, as indicated by, for example, a voltage across a sense resistance 124. As shown here the sense resistance is in the "low" side, in the return path between the variable load 122 and the negative contact 118, but those skilled in the art will appreciate that current can similarly be sensed on the high side, between positive contact 114 and the variable load. Once the battery voltage and current are determined at a first load, a different load is applied to the battery by changing the value of the variable load 122 so that a second battery voltage and current can be sense. The dynamic impedance of the battery can then be determined as the ratio of the difference of the first voltage and the second voltage to the difference of the first current and the second current. That is, $Z_D=(V_{L1}-V_{L2})/(I_{L1}-I_{L2})$, where $Z_D$ is the dynamic impedance, $V_{L1}$ is the battery voltage under the first load, $V_{L2}$ is the battery voltage under the second load, $I_{L1}$ is the battery current under the first load, and $I_{L2}$ is the battery current under the second load. The first and second loads can be substantially different. For example, the first load can be selected to draw a current at substantially the "C" rate (the capacity of the battery expressed in ampere hours divided by one hour), while the second load can be selected to draw approximately $1/10^{th}$ the "C" rate. Once the dynamic impedance is determined, then a fixed load be applied to the battery, such as by setting the variable load to a discharge value and leaving it at the discharging value until battery is fully discharged, as determined by known end of charge criteria (e.g. a voltage level at a given current rate). Once the dynamic impedance is determined, the controller can determine a battery condition or battery condition category by categorizing the dynamic impedance into one of a plurality of battery condition categories. That is, for example, battery condition can be one of a plurality of categories or discrete states that correspond to ranges of impedance. The dynamic impedance can be mapped to one of the ranges, and a corresponding condition can be determined. For example battery condition can be one "very good," "good," "acceptable," "poor," and "very poor." The battery condition is not the state of charge of the battery, which can be separately determined and indicated. Rather, the battery condition refers to the "health" of the battery 104, and can be generally related to the cycle life of the battery 104. Once the battery condition is determined it can be written into the memory 110 of the battery pack 104. Furthermore, the battery condition can be visually indicated by the discharger via a visual indicator, such as a light emitting diode (LED) array or graphical display (e.g. liquid crystal display). The battery condition can be represented in the memory 110 as a binary value in a specific memory location, a string that can be displayed by a device (once attached to the battery 104, and able to read the memory 110).

The discharger 102 can further include a modular interface including modular contacts 128, 130, 132 that are configured to connect the discharger 102 to an external discharging module 126. The external discharging module 126 can include mating contacts 134, 136, 138 for connecting the discharger 102. The connection can be made by a connector, spring contacts, and may or may not be facilitated by mating mechanical features. The external discharging module 126 can include a load 140. The internal load network (variable load 122) of the discharger 102, while in some embodiments can be a very low resistance, in some embodiments the lowest value of the variable load 122 can be dictated by power dissipation considerations, cost consideration, or a combination of those and other considerations. Thus, external discharging module 126 can be designed to handle a higher level of power dissipation to allow faster discharging of the battery 104. When the external discharging module 126 is connected to the discharger 102, it can be detected by the controller 120 as a signal or change of signal level at contact 128, which changes when the external discharging module 126 is connected to the discharger 102. Upon detecting the external discharging module 126, the discharger 102 can connect the battery 104 to the load 140 of the external discharging module 126 by closing switch 142. When the external discharging unit is connected, the discharger selectively apply the internal load network (variable load 122), the external load 140 (through switch 142), or both, based on, for example, battery information in memory 110, a selected discharge rate as input to the discharger 102 such as by, for example, a selector switch or keypad (not shown).

Figure 2:
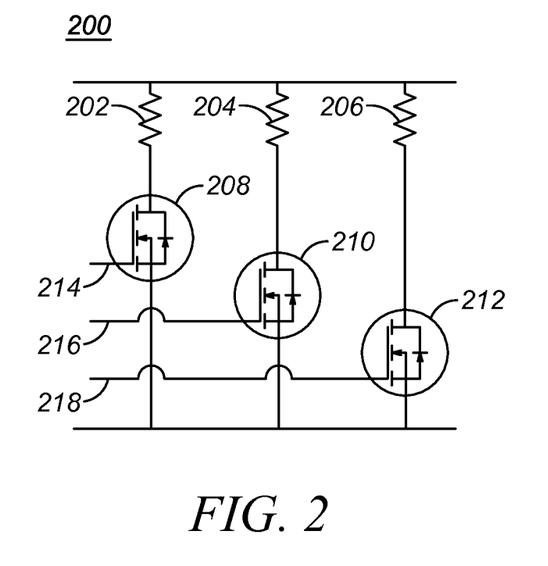
FIG. 2 is a schematic diagram of a variable load in accordance with some embodiments.

FIG. 2 is a schematic diagram of a variable load 200 in accordance with some embodiments. The variable load 200 can be, in some embodiments, used in variable load 122 of FIG. 1. The variable load comprises a plurality of resistances 202, 204, and 206 that each have a different value for discharging at different rates. Each of the resistances 202, 204, 206 are selectable by a corresponding switch transistor 208, 210, 212, which are each controlled, respectively, by lines 214, 216, and 218, which can be coupled to the controller 120, for example. Using, for example, three resistances 202, 204, 206, a simple 3 bit digital word can be used to select a desired load resistance, yielding 8 different effective load resistances ($2^3$ choices), where each resistance 202, 204, 206 can be applied individually, or in various parallel combinations with each other.

Figure 3:
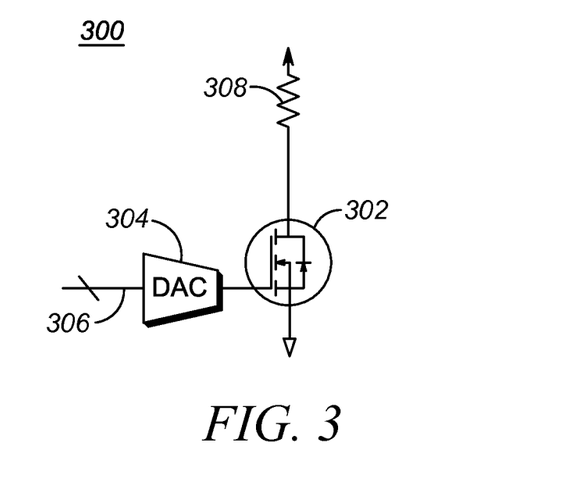
FIG. 3 is a schematic diagram of a variable load in accordance with some embodiments.

FIG. 3 is a schematic diagram of a variable load 300 in accordance with some embodiments. The variable load 300 can be, in some embodiments, used in variable load 122 of FIG. 1. Unlike in FIG. 2, where a plurality of discrete fixed resistances are used, the variable load 300 uses a regulator device 302 that is operated as a variable resistance by adjusting the bias applied to the regulator device, such as by, for example, a digital to analog converter 304, which converts a digital value 306 to an analog output. The digital value 306 can be provided by the controller 120 of FIG. 1, for example.

Figure 4:
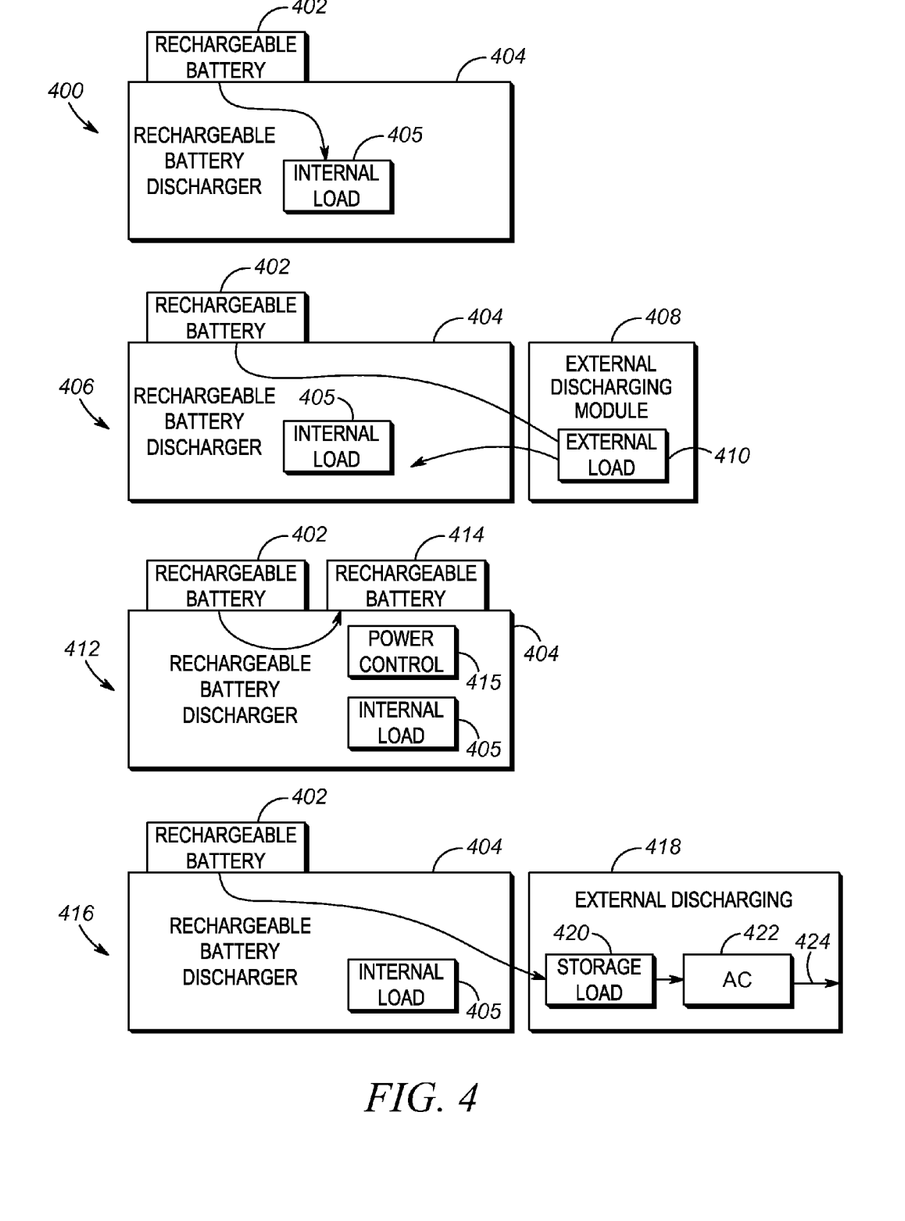
FIG. 4 is a series of battery discharging system configuration block diagrams in accordance with some embodiments.

FIG. 4 is a series of battery discharging system configuration block diagrams 400, 406, 412, 416 in accordance with some embodiments. In each of the configurations 400, 406, 412, 416 a rechargeable battery 402 is connected to a rechargeable battery discharger 404, and in each configuration 400, 406, 412, 416 the rechargeable battery discharger 404 is operable to determine a condition of the rechargeable battery 402. The rechargeable battery discharger, upon discharging the rechargeable battery 402, can be operable to recharge the rechargeable battery 402 using conventional charging techniques. In configuration 400 the battery 402 is discharged through an internal load network 405 that can include a variable load. The discharge rate of the rechargeable battery discharger 404 is limited by reliability and safety concerns, and thus, it may have a relatively slow discharge rate compared to other configurations, but can be the most "portable" configuration.

In configuration 406 an external discharging module 408 is coupled to the rechargeable battery discharger 404, and contains a load 410 that allows the rechargeable battery 402 to be discharged faster than when discharged only through the internal load network 405. The rechargeable battery discharger can route discharge current from the battery through the internal load network 405, the external load 410, or both. The external discharging module 408 and the rechargeable battery discharger can have an interface that allows the rechargeable battery discharger 404 to control the external load 410 and set it to a selected load value to achieve a desired discharge rate.

In configurations 412 and 416 a storage load is used. In configuration 412 the rechargeable battery 402 is discharged into another rechargeable battery 414. The rechargeable battery discharger 404 can have power control circuitry 415 that can step up or step down (e.g. buck/boost) the voltage of rechargeable battery 402 to recharge battery 414, thus recovering some of the energy stored in rechargeable battery 402 rather than dissipating it as heat. The other recharge battery 414 can be coupled directly to the rechargeable battery discharger 404, such as by means of a charging pocket or other means for holding the battery 414, or it can be charged through an external discharging module, similar to external discharging module 408 that includes features for holding a battery to be charged and can include the charging circuitry as well.

Configuration 416 shows an external discharging module 418 which includes a storage load 420 into which rechargeable battery 402 is discharged, thereby recovering some of the energy of rechargeable battery 402 rather than dissipating it as heat. Furthermore, external discharging module 418 contains an alternating current (AC) inverter 422 which produces standard AC service 424 (e.g. 100-240 volts, root mean square, at 50-60 Hz). In some embodiments several rechargeable battery dischargers can be coupled to external discharging module 418 that discharge into storage load 420, and the AC service produced by the inverter 422 can be used to power other device, including battery chargers.

Figure 5:
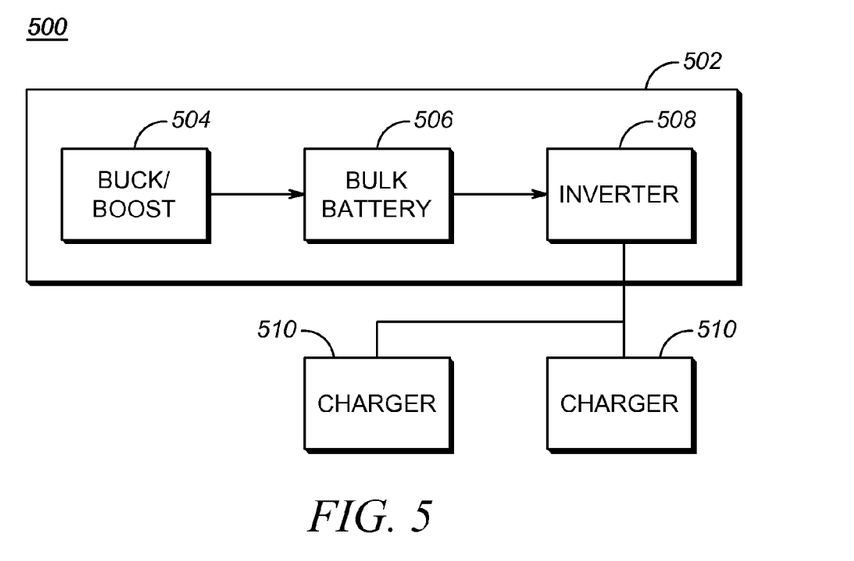
FIG. 5 is a block diagram of an external module for use with a modular discharging system in accordance with some embodiments.

FIG. 5 is a block diagram 500 of an external discharging module 502 for use with a modular discharging system in accordance with some embodiments. The external discharging module 502 can be similar to external discharging module 418 of FIG. 4, and can contain a buck/boost power converter 504 that receives voltage and current from a battery being discharged in a rechargeable battery discharger coupled to the external discharging module 502. The buck/boost power converter 504 coverts the received voltage and current to charge a storage load (battery) 506. For example, the battery being discharged (e.g. battery 402 in FIG. 4) can have a nominal operating voltage of 4 volts, while storage battery 506 can have a nominal voltage of 12 volts, and buck/boost converter 504 will step up the discharge voltage of the battery being discharged to 12 volts (or slightly more) so as to charge battery 506. The battery 506 can be a bulk battery, such as an array of 12 volt lead-acid batteries, and provides power to an AC inverter 508. The AC inverter 508 converts the voltage of battery 506 up to standard AC service, allowing it to power, for example, other battery chargers 510 which can be older, legacy chargers.

Figure 6:
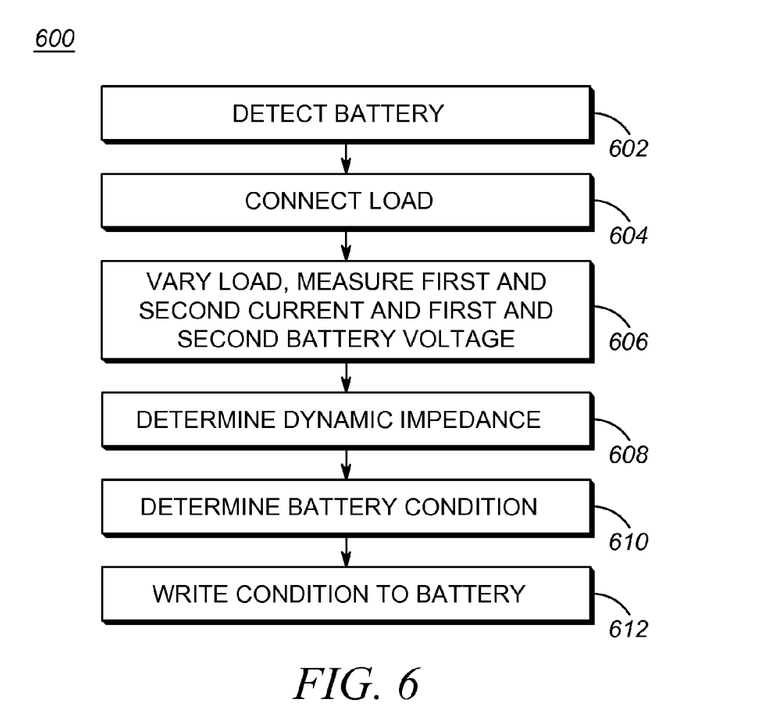
FIG. 6 is a flow chart diagram of a method of discharging a battery and determining a condition of the battery in accordance with some embodiments.

FIG. 6 is a flow chart diagram of a method 600 of discharging a battery and determining a condition of the battery in accordance with some embodiments. The flow chart illustrates the method as a series of processes, each process represented by a box in the flow chart, and can include varies sub-processes not specifically indicated but that will be realized by those skilled in the art upon reading the teachings method 600. The method is performed by a rechargeable battery discharger, such as that shown in FIGS. 1 and 4, with a rechargeable battery that is to be discharged. In particular, the method can be performed under control of a controller, such as a microcontroller that is interfaced with elements in the rechargeable battery discharger (e.g. a variable load, voltage and current sensing) and operable, such as by executing instruction code stored on a computer program product coupled to the controller, to perform the processes described here. Accordingly, the method 600 is commenced by connecting the rechargeable battery to the rechargeable battery discharger, whereupon the rechargeable battery discharger can detect the presence of the rechargeable battery in process 602, such as upon the rechargeable battery being connected to the rechargeable battery discharger. Upon detecting the rechargeable battery, the rechargeable battery discharger can connect a load to the rechargeable battery, such as an internal load network, or an external load, or both. The load can be selected based on information read from the rechargeable battery, such as reading the information from a memory in the rechargeable battery. At least part of the load connected to the rechargeable battery is variable, under control of the rechargeable battery discharger. The rechargeable battery discharger then commences determining the dynamic impedance of the rechargeable battery by varying the load and measuring or sensing the battery voltage and current, as indicated in process 606. Specifically, the rechargeable battery discharger can apply a first load to the rechargeable battery, and measure a first battery voltage and first battery current, then apply a second load to the rechargeable battery (which is significantly different than the first load) and measure a second battery voltage and battery current. The dynamic impedance is then determined as the ratio of the difference between the first and second battery voltages to the difference between the first and second battery currents, as indicated in process 608. The method then commences to determining the battery condition based on the dynamic impedance in process 610. The rechargeable battery discharger can contain, for example, a look-up table to cross reference dynamic impedance with battery type, to categorize the dynamic impedance by range into one of a plurality of battery condition categories. The rechargeable battery discharger can then write the battery condition into the rechargeable battery memory in process 612. In some embodiments the battery condition can be determined by determining the dynamic impedance at different levels of discharge and comparing or averaging the results. In addition to determining the battery condition in method 600, the rechargeable battery discharger can discharge the battery in a variety of ways, such as by selecting a load, which can include selecting an internal load, an external load, a storage load, and so on, as taught in reference to FIG. 4.

Figure 7:
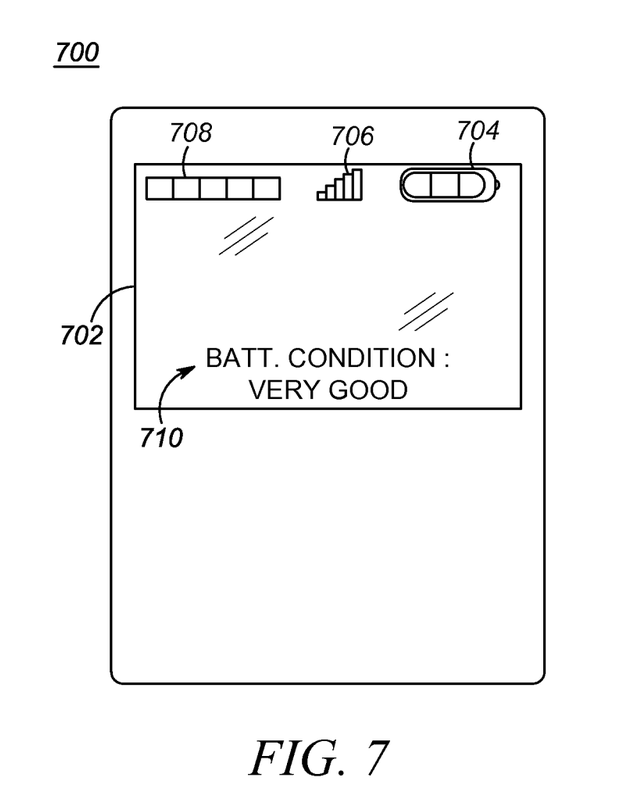
FIG. 7 shows a battery powered device that displays a battery condition as determined by a rechargeable battery discharger in accordance with some embodiments.

FIG. 7 shows a battery powered device 700 that displays a battery condition as determined by a rechargeable battery discharger in accordance with some embodiments. The device can be, for example, a portable communication device such as portable two-way radio. The device can have a graphical display 702 that can be, for example, a LCD display, on which the device 700 can display information, including battery information. For example, the device 700 can display a battery state of charge 704, a received signal level 706, and battery condition 708, 710. The battery condition can be indicated in a bar graph 708, or textually 710 in response to the battery condition query, for example.

Accordingly, embodiments provide the benefit of determining a battery condition for batteries that lack an internal life cycle management function to track cycle life and other parameters relevant to battery condition. The battery condition can be determined while discharging the battery in preparation for charging, or to simply recover stored energy from the battery if the battery is not going to be used for a time. Furthermore, the rechargeable battery discharger can be a modular system that allows expansion of the system, to permit faster discharging, and allows users to purchase a system configuration appropriate to their particular needs.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued. The battery can be discharge into a storage load to recover or transfer the energy from the battery being discharged to another battery.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized controllers or processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method for discharging a rechargeable battery, comprising:
    discharging a rechargeable battery;
    monitoring a dynamic battery current and a dynamic battery voltage of the rechargeable battery while discharging the rechargeable battery, wherein monitoring the dynamic battery current and dynamic battery voltage comprises:
        applying a first load to a rechargeable battery
        determining a first current and a first battery voltage provided by the rechargeable battery responsive to applying the first load;
        applying a second load to the rechargeable battery;
        determining a second current and a second battery voltage provided by the rechargeable battery responsive to applying the second load;

determining a dynamic impedance of the rechargeable battery responsive to monitoring the dynamic battery current and the dynamic battery voltage, wherein the dynamic impedance is determined as a ratio of the difference between the first battery voltage and the second battery voltage and the difference between the first current and the second current; and determining a battery condition category by categorizing the dynamic impedance into one of a plurality of battery condition categories.

2. The method of claim 1, further comprising writing the battery condition category into a memory of the rechargeable battery.

3. A method for discharging a rechargeable battery, comprising:

discharging a rechargeable battery, wherein the discharging is performed by a modular discharging unit having an internal load network and a modular interface to interface with a plurality of external load modules, discharging the rechargeable battery comprises:

determining that at least one external load module is connected to the modular discharging unit; and selecting either the internal load network or the external load module for discharging the rechargeable battery, wherein the selecting either the internal load network or the external load module for discharging the rechargeable battery is performed based on a capacity of the rechargeable battery;

monitoring a dynamic battery current and a dynamic battery voltage of the rechargeable battery while discharging the rechargeable battery;

determining a dynamic impedance of the rechargeable battery responsive to monitoring the dynamic battery current and the dynamic battery voltage; and determining a battery condition category by categorizing the dynamic impedance into one of a plurality of battery condition categories.

4. A method for discharging a rechargeable battery, comprising:

discharging a rechargeable battery, wherein the discharging is performed by a modular discharging unit having an internal load network and a modular interface to interface with a plurality of external load modules, discharging the rechargeable battery comprises:

determining that at least one external load module is connected to the modular discharging unit; and selecting either the internal load network or the external load module for discharging the rechargeable battery, wherein the selecting either the internal load network or the external load module for discharging the rechargeable battery comprises selecting an external module having a storage load that is charged by discharging the rechargeable battery through the storage load, and wherein selecting an external module having a storage load comprises selecting an external module having an alternating current (AC) inverter coupled to the storage load that provides standard AC service from the storage load;

monitoring a dynamic battery current and a dynamic battery voltage of the rechargeable battery while discharging the rechargeable battery;

determining a dynamic impedance of the rechargeable battery responsive to monitoring the dynamic battery current and the dynamic battery voltage; and determining a battery condition category by categorizing the dynamic impedance into one of a plurality of battery condition categories.

5. The method of claim 4, further comprising visually indicating the battery condition category.

6. A battery discharger, comprising:

a battery connector interface configured to connect the battery discharger to a rechargeable battery including positive and negative contacts and a data contact;

an internal load network configured to produce a variable load;

a controller having a data port coupled to the data contact and operable to vary the load of the internal load network;

a current sense circuit operable to indicate a current level through the internal load network to the controller;

a voltage sense circuit operable to indicate a voltage level between the positive and negative contacts to the controller; and the controller is further operable to vary the internal load network to monitor a dynamic battery current and a dynamic battery voltage of a rechargeable battery, determine a dynamic impedance of the rechargeable battery from the dynamic battery current and the dynamic battery voltage, and determine a battery condition category based on the dynamic impedance.

7. The battery discharger of claim 6, wherein the controller is further operable to write the battery condition category into a memory of the rechargeable battery.

8. The battery discharger of claim 6, further comprising a modular interface configure to connect to an external load module.

9. The battery discharger of claim 6, wherein the controller determines the dynamic battery impedance by applying a first load of the variable load network to a rechargeable battery and determining a first current and a first battery voltage provided by the rechargeable battery responsive to applying the first load;

applying a second load of the variable load network to the rechargeable battery, and determining a second current and a second battery voltage provided by the rechargeable battery responsive to applying the second load; and wherein the dynamic impedance is determined by the controller as a ratio of the difference between the first battery voltage and the second battery voltage and the difference between the first current and the second current.

10. The battery discharger of claim 8, the controller is further operable to determine that at least one external load module is connected to the battery discharger; and select either the internal load network or the external load module for discharging the rechargeable battery.

11. The battery discharger of claim 10, wherein the controller determines a capacity of the rechargeable battery and selects either the internal load network or the external load module for discharging the rechargeable battery based on a capacity of the rechargeable battery.

12. The battery discharger of claim 6, further comprising a visual display element, and wherein the controller is further configured to indicate the battery condition via the visual display element.

13. A modular battery discharging system, comprising:

a battery discharger configured to connect to a rechargeable battery and discharge the rechargeable battery, and including a variable load network operable to determine a dynamic impedance of the rechargeable battery and to determine a battery condition based on the dynamic battery impedance, the battery discharger further including a modular interface;

at least one external discharging module configured to be connected to the modular interface, and having a load for discharging the rechargeable battery; and the battery discharger is operable to discharge the rechargeable battery through the internal load network, the at least on external discharging module, or both.

14. The modular battery discharging system of claim 13, wherein the battery discharger is further operable to write the battery condition into a memory of the rechargeable battery.

15. The modular battery discharging system of claim 13, wherein the at least one external discharging module comprises a storage load.

16. The modular battery discharging system of claim 15, wherein the at least one external discharging unit comprising the storage load further comprises an alternating current (AC) inverter operable to produce a standard AC service from the storage load.

17. The modular battery discharging system of claim 16, wherein the at least one external discharging unit comprising the storage load further comprising a buck/boost regulator through which the rechargeable battery discharges into the storage load.

\* \* \* \* \*